(12) United States Patent
Gholson, III et al.

(10) Patent No.: US 7,966,140 B1
(45) Date of Patent: Jun. 21, 2011

(54) RADIO FREQUENCY POWER METER

(76) Inventors: Norman H Gholson, III, Gulfport, MS (US); Gordon E. Hardman, Boulder, CO (US)

( * ) Notice: Subject to any disclaimer, the term of this patent is extended or adjusted under 35 U.S.C. 154(b) by 639 days.

(21) Appl. No.: 12/106,056

(22) Filed: Apr. 18, 2008

(51) Int. Cl.
*G01R 21/00* (2006.01)
*G01R 21/06* (2006.01)
*G01R 23/16* (2006.01)

(52) U.S. Cl. .......................... 702/61; 702/60; 702/76

(58) Field of Classification Search ............ 702/60, 702/61, 76
See application file for complete search history.

(56) References Cited

U.S. PATENT DOCUMENTS

| | | | |
|---|---|---|---|
| 5,872,456 A * | 2/1999 | Roderick et al. | 324/637 |
| 5,936,575 A * | 8/1999 | Azzarelli et al. | 342/362 |
| 7,248,129 B2 | 7/2007 | Hubert | |
| 7,822,565 B2 * | 10/2010 | Brouk et al. | 702/77 |
| 2009/0048792 A1 * | 2/2009 | Turner | 702/60 |
| 2009/0281741 A1 * | 11/2009 | van Zyl | 702/60 |

\* cited by examiner

*Primary Examiner* — Michael P Nghiem
(74) *Attorney, Agent, or Firm* — Russell Carter Gache; Maynard Cooper & Gale, PC

(57) ABSTRACT

An in-line directional radio-frequency ("RF") power meter for measuring power and other parameters in a transmission line. The meter simultaneously measures complex voltage-waves traveling in the forward and reverse directions of a connected transmission line and processes measured voltages to compute forward and reverse power, standing wave ratio, and impedance values. The apparatus includes a microprocessor having microcode for digitally computing RF power parameters, and a field programmable gate array ("FPGA") having microcode for executing complex Fast Fourier Transforms ("FFT") to calculate voltages and frequencies, a microprocessor with attached firmware to make a series of complex calculations relative to sensed electrical values in the transmission line and to pass certain calculated values to the device to communicate RF power parameters to a user. The configuration of the apparatus allows for measurement of RF power parameters in a relatively economical package.

22 Claims, 6 Drawing Sheets

RADIO FREQUENCY POWER METER

FIELD OF THE INVENTION

The present invention relates generally to systems that measure transmission power within a radio frequency medium. More particularly, the present invention relates to apparatuses and methods for measuring radio frequency ("RF") voltage, power, impedance and other relevant parameters in an RF power transmission system to allow for optimization of a transmission power source.

BACKGROUND OF THE INVENTION

Currently available apparatuses that measure power parameters in a RF power transmission system typically utilize inductive type pickup coils positioned transverse to a connected transmission line. The coils sense voltage variations related to forward- or reverse-traveling voltage waves on the transmission line and this voltage is rectified and used to drive an analog meter displaying a human perceptible value. However, these types of devices are not capable of measuring complex impedance which is an important quantity in RF power calculations.

In addition, current instruments generally use electrical assemblies containing an inductive pickup coil, a resistor-capacitor frequency compensator, and a diode rectifier to provide a direct current ("DC") signal related to forward- and reverse-traveling waves on the transmission line. A deficiency with this type of design is that the assembly will only accommodate a relatively limited frequency range of, for example, 25-60 MHz or a ratio of approximately 2.5:1, with a "feasible" ratio of 5:1. Additionally, such configurations accurately measure a relatively small range of RF power (e.g. 150 to 1000 Watts or a ratio of about 7:1).

These aforementioned limitations result in several different assemblies being required to accommodate even a modest range of frequencies and RF power amplitudes, and such assemblies are relatively expensive due to precise machining and high quality componentry required to achieve a high quality, high directivity directional coupler. Hence, what is needed in the industry is a relatively inexpensive RF meter that is able to accurately measure all of the RF power parameters required to optimize a radio frequency transmissions source.

SUMMARY OF THE INVENTION

In summary, the invention includes a coupler connected to a RF power transmission system, a filter to compensate for reception of voltage signals through the coupler, an analog to digital ("A-D") converter for digitizing the received voltage signals from the coupler, a microprocessor having microcode for digitally computing RF power parameters, a field programmable gate array ("FPGA") having microcode for executing complex Fast Fourier Transforms ("FFT") responsive to microprocessor command signals, and a display device for displaying RF power parameters in human comprehendible values.

In the aforementioned system, acceptable power parameters may be obtained by connecting a relatively inexpensive semi-directional coupler such as a coupled microstrip for wide-frequency-band use to a transmission line, sensing right and left radio frequency voltage signals over an acceptable frequency range, filtering the received right and left signals to partially compensate for the frequency dependent coupling, and using FFT's and other calculations to calculate RF power parameters such as $V_F$, $V_R$, $S_{11}$, SWR, $P_F$, $P_R$, $P_d$ and Z, and displaying those results on a human perceptible display.

BRIEF DESCRIPTION OF THE DRAWINGS

An RF power meter and method incorporating the features of the apparatus are depicted in the attached drawings which form a portion of the disclosure and wherein.

DESCRIPTION OF THE PREFERRED EMBODIMENTS

Figure 1:
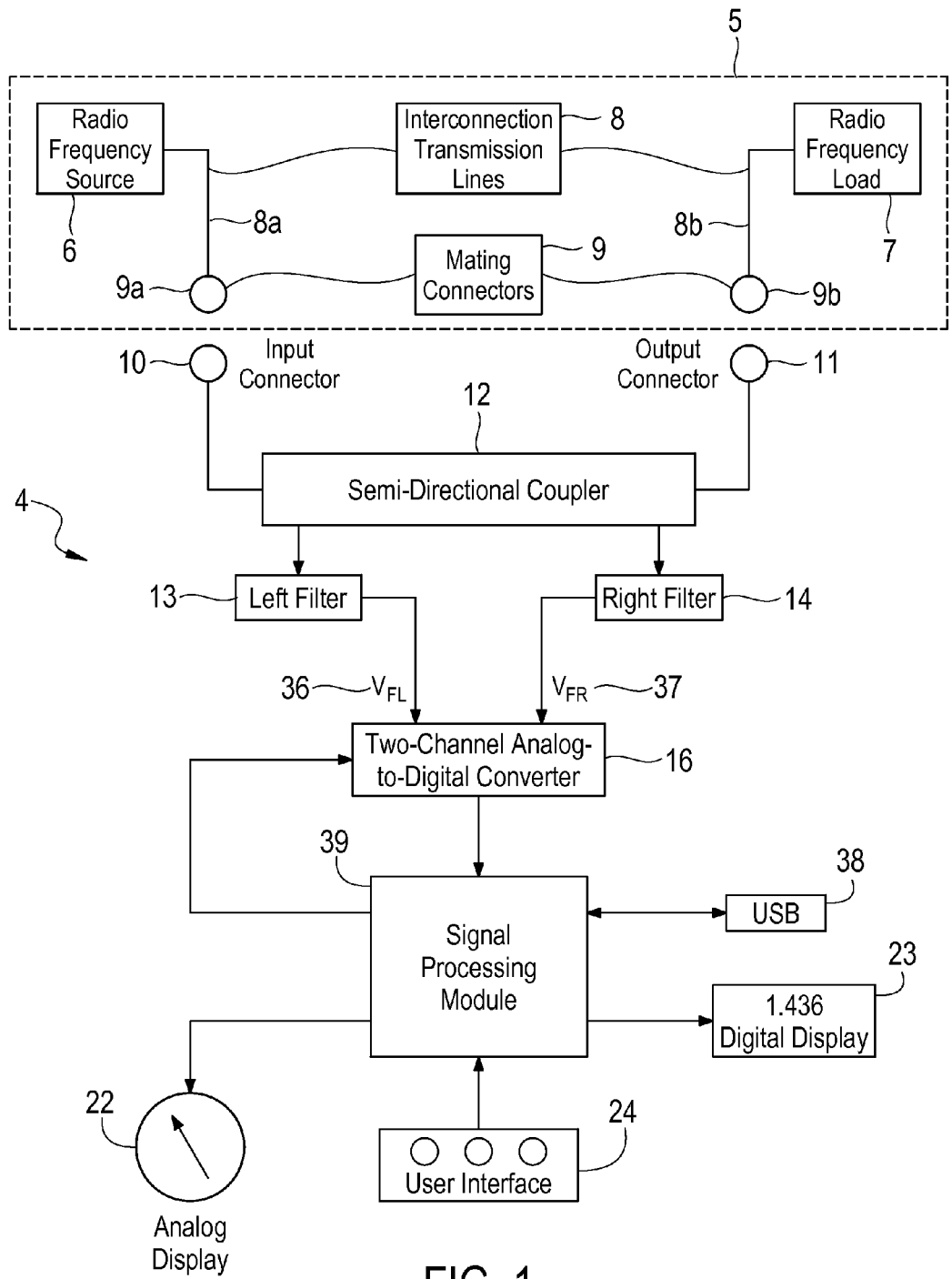
FIG. 1 is a block diagram of the preferred embodiment of the apparatus.

Referring to the drawings for a better understanding of the function and structure of the system, it will be shown generally that the preferred embodiment 4 shown in FIG. 1 includes a coupler 12, sometimes referred to herein as a "semi-directional" coupler, a pair of connectors such as an input connector 10 and output connector 11 connecting the coupler 12 to a transmission system 5, a pair of filters 13, 14 to partially compensate for sensing limitations of the coupler 12 in each side or channel of the semi-directional coupler (hereinafter referred to as "left" and "right" sides of the coupler), an A-D converter 16 for digitizing filtered left voltage waveforms $V_{FL}$ 36 and for digitizing filtered right voltage waveforms $V_{FR}$ 37, and a signal processing module 39 for processing signal waveforms, displays 22, 23, and a user interface 24. The preferred embodiment 4 is optimized for transmitter frequencies bounded between 1.8 MHz and 450 MHz and for an analog-to-digital converter capable of sampling at rates of less than or equal to 65 mega-samples per second with 14 bits of resolution. Further, the processing module 39 utilizes a Fourier Transform size of 1024 points. However, the system is not so limited to these frequencies, sampling rates, number of bits, or Fourier Transform size and may be varied as may be understood to accommodate other variants of the herein described system.

The apparatus 4 is configured to be positioned "in-line" with regard to the transmission medium 8 by installing it between the transmitter 6 and load 7 of, for example, a coaxial transmission line 8b that is attached to an antenna. In particular, the apparatus becomes part of the RF transmission line 8 of the RF power transmission system 5 and therefore passes full-power RF signals during operation of the apparatus. The apparatus optimizes the operation of the transmitter by maximizing power delivered to the load and measures the absolute magnitude of the voltage- and power-waves traveling in the forward and reverse directions on the coaxial transmission line 8b of the RF power transmission system 5. The apparatus 4 measures forward- and reverse-traveling power ($P_f$ and $P_r$); Standing Wave Ratio ("SWR"); real and imaginary parts of the load impedance (Z); delivered power ($P_d$); forward- and reverse-traveling voltage ($V_f$ and $V_r$); and a complex scattering parameter $S_{11}$.

In operation, a radio frequency (RF) transmitter 6 is connected to the input connector 10 via connector 9a and a coaxial transmission line 8b leading to a load 7 is connected to the output connector 11 via connector 9b. Voltage waves travel in the forward and reverse direction on the transmission line 8 from the output connector 11 to the load 7. The forward direction is defined as from the transmitter 6 to the load 7. The reverse direction is defined as from the load 7 to the transmitter 6. The apparatus measures the complex (real and imaginary) components of the forward- and reverse-traveling waves and uses these measurements to compute other parameters of interest.

Figure 2:
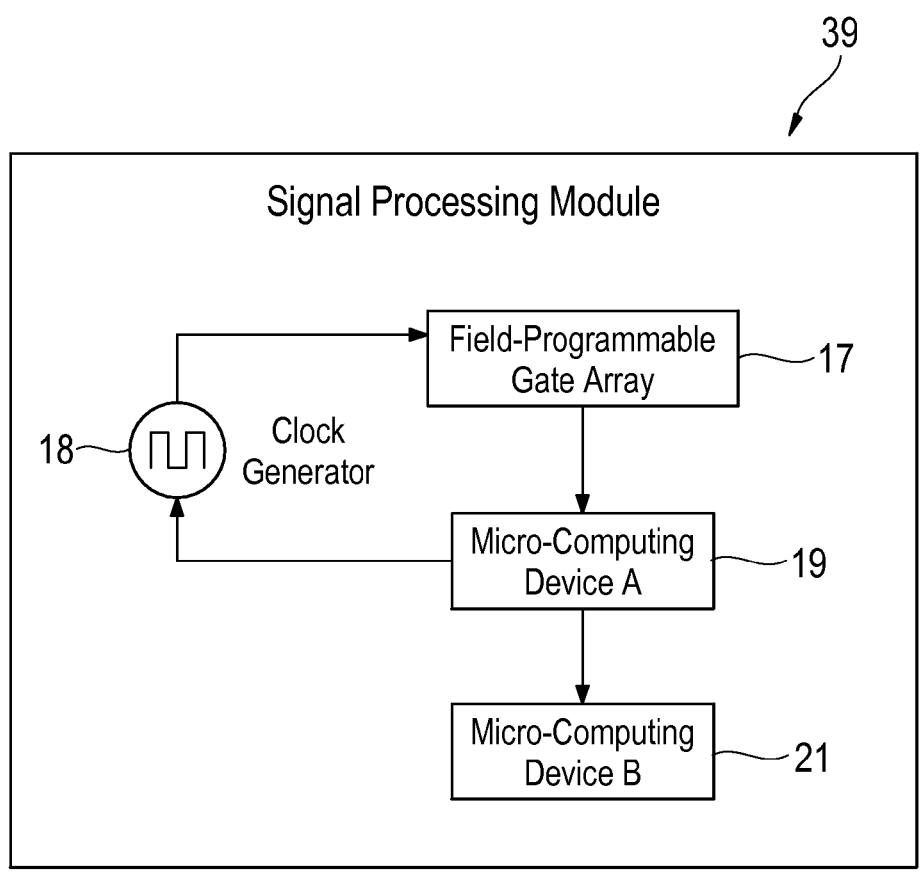
FIG. 2 is a detailed diagram of the hardware signal processing module of the apparatus shown in FIG. 1.

Referring now to FIG. 2, the signal processing module 39 includes micro-computing device A 19 and B 21, such as inexpensive and readily available 8 or 16 bit microprocessors, an FPGA 17, and a clock generator 18. As is known in the art, FPGAs can be configured to process complex equations at high speed rates and are relatively easy to program with today's FPGA design tools. FPGA 17 is configured to include processing logic structure to execute FFT algorithms and to compute various measured frequencies of $V_{FR}$ 37 and $V_{FL}$ 36. Similarly, devices 19 and 21 either include onboard programmable memory or are configured to communicate with other programmable processor memory within module 39. Such memory is loaded with mathematical equations, calibration data, and algorithmic processing steps as will be described. Module 39 is a typical printed circuit wire board ("PWB") connecting such components, as is also known in the art. The inventor expects that the herein described methods and algorithms are readily compiled for execution by either devices 19 and 21, but in practice device 21 would be dedicated to passing data and controlling displays 22, 23, and user interface 24, and USB communications port 38, if utilized, and device 19 would be dedicated to performing the herein described calculations, except for FFT algorithms which would be executed by the programmed state machine operation of FPGA 17.

Figure 3:
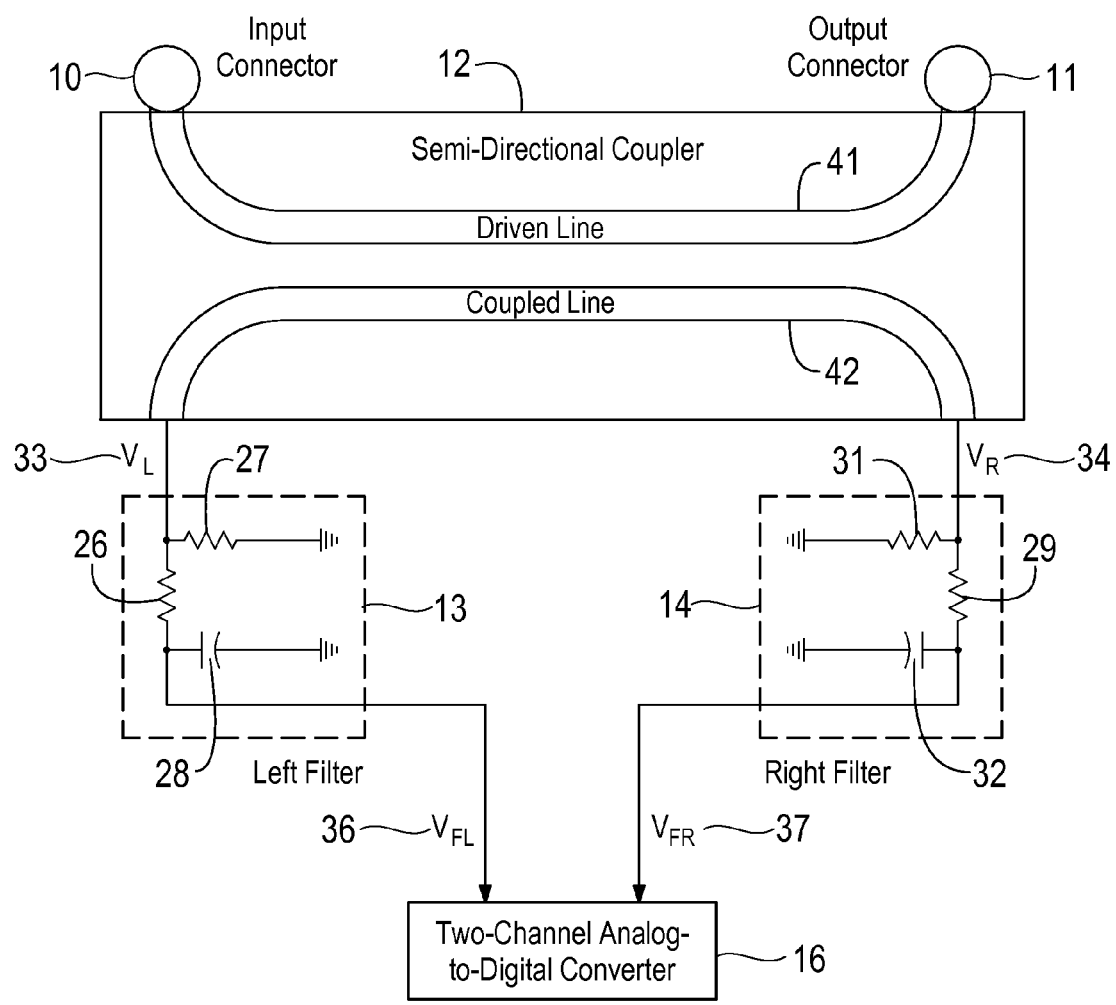
FIG. 3 is a further electrical diagram of the RF connectors, semi-directional coupler, and the compensating filters for each right and left channel.

As may be now seen in FIG. 3, the semi-directional coupler 12 is shown to have a structure similar to a parallel-strip coupler such as a microstrip. The apparatus will perform its claimed operations with a parallel-strip coupler, but is not limited to this device. As noted above, the semi directional coupler can be a directional coupler but does not have to be of very high quality or directivity. Directional couplers are passive devices which couple part of the transmission power by a known amount as the signal passes through the coupler and out through another port, often by using two transmission lines set close enough together so energy passing through one transmission line is coupled to the other transmission line. Hence, the coupler is not required to be a high quality (i.e. having "high directivity") coupler, which significantly reduces the cost of the apparatus. The signal that is passed to the load enters the coupler 12 through the input connector 10 and exits through the output connector 11. The coupled output from the coupler 12 is used to obtain information (such as frequency and power level) of the transmitted signal without interrupting the main power flow in the system (except for a slight power reduction).

As shown, the coupled line 42 of the coupler 12 provides a left output voltage VL (or "$V_L$") 33 and a right output voltage VR (or "$V_R$") 34. These two voltages are related to the forward and reverse traveling waves on the coaxial transmission line that is connected to output connector 11. The coupling properties of the coupler 12 typically vary with frequency. For the case of a microstrip type coupler that is physically small compared to a measured wavelength, if the frequency is doubled while the magnitude of the forward and reverse traveling waves on the coaxial transmission line remain constant, the voltages $V_L$ 33 and $V_R$ 34 will approximately double. The left filter 13 network includes resistors 26, 27 and a capacitor 28 to effectively form an RC input circuit. The purpose of this filter is to attempt to compensate for the frequency dependent nature of the semi-directional coupler 12 and to provide an energy storage element 28 to enhance performance of the two channel analog-to-digital converter 16 when digitizing $V_{FL}$ 36. Similarly to the left filter 13, the right filter 14 network consists of resistors 29, 31 and a capacitor 32 and provides the same function as filter 13, but for signal $V_R$ 34.

Figure 4:
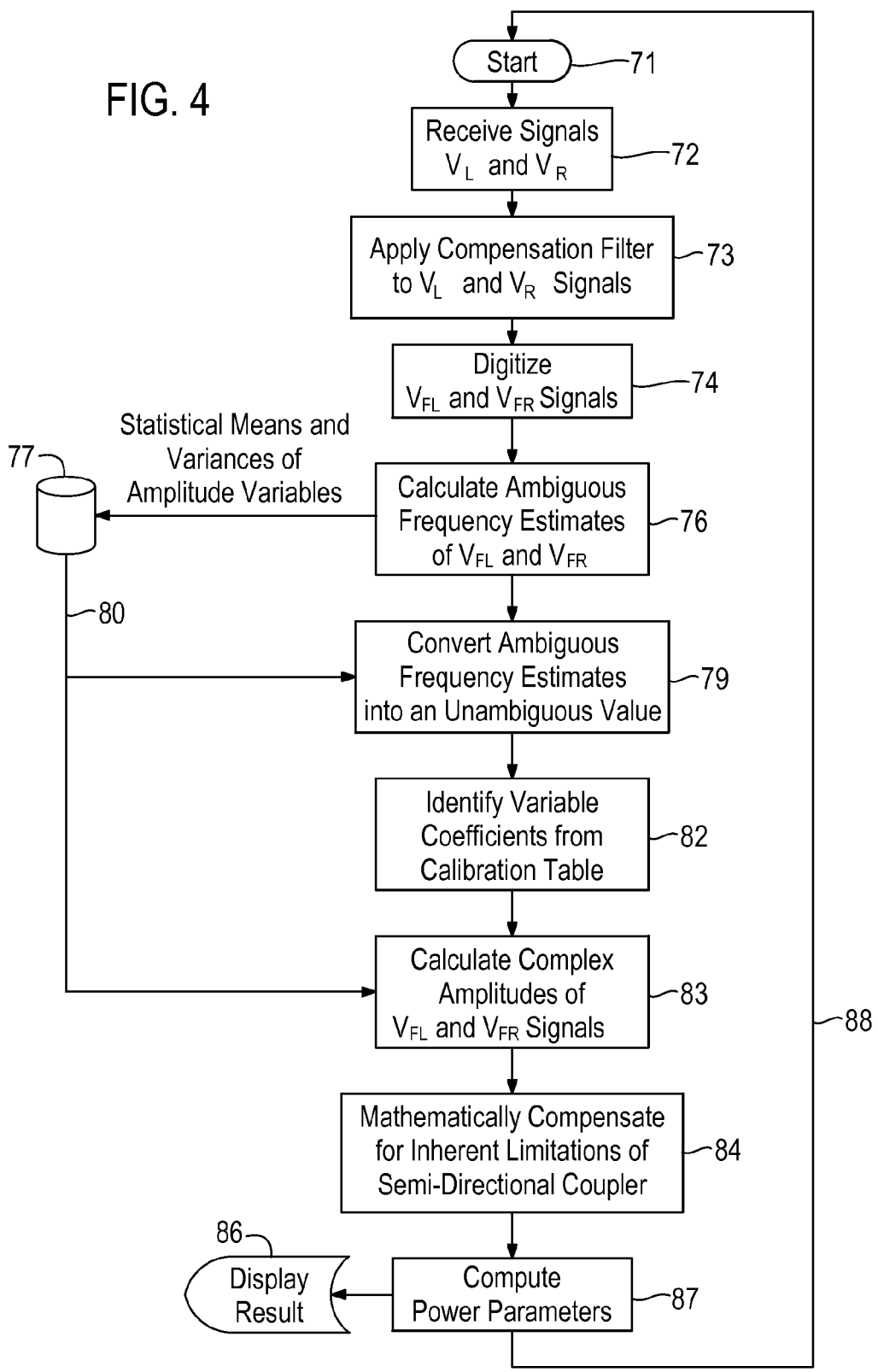
FIG. 4 is a top level flow chart of the steps of the method implemented in the apparatus of FIG. 1 to obtain preferred power parameters.

Referring now to FIG. 4, while also referring back to FIGS. 1-3, it may be seen generally that signals $V_L$ 33 and $V_R$ 34 are received 72 by the apparatus via connectors 10 and 11 as previously described. After being filtered 73, $V_{FL}$ 36 and $V_{FR}$ 37 ("F" referring to post filtered signals), signals $V_{FL}$ and $V_{FR}$ are digitized 74 as time-series samples at N different sample rates. The number of sample rates required is a function of the specified operating frequency range of the apparatus and the maximum sample-rate capability of the A/D converter 16. For the preferred embodiment, three (N=3) sample rates of 65-, 64-, and 63 mega-samples/second are sufficient to compute a non-ambiguous frequency estimate for a signal whose frequency is bounded between 0-500 mega-Hertz. The $V_{FL}$ $V_{FR}$ samples are then converted into the frequency domain using a set of FFT calculations 76 to obtain a sufficiently large set of ambiguous frequency estimates to later compute 79 a non-ambiguous frequency estimate of the signal represented by the voltages $V_{FL}$ 36 and $V_{FR}$ 37. Variable coefficients are identified from a calibration table 82, stored in memory for use by microprocessor 19 and used in the final stages of the process. The values in the calibration table are established by making measurements to the apparatus or its components and is done as part of the manufacturing process (see paragraph N, infra). Complex amplitudes of the $V_{FL}$ and $V_{FR}$ signals are then calculated 83, and using these complex Fourier Transform components describing $V_{FL}$ and $V_{FR}$, along with a frequency-dependent mathematical transform, compensations 84 for the poor performance of the semi-directional coupler 12 are made. The apparatus then computes 87 the forward-traveling voltage amplitude $V_F$, reverse-traveling voltage amplitude $V_R$, complex scattering parameter $S_{11}$, forward-traveling power $P_F$, reverse-traveling power $P_R$, delivered power $P_d$, and complex load impedance Z, and displays the result 86. The process is continually refreshed 88 to maintain accurate readings and ensure result consistency.

Figure 5:
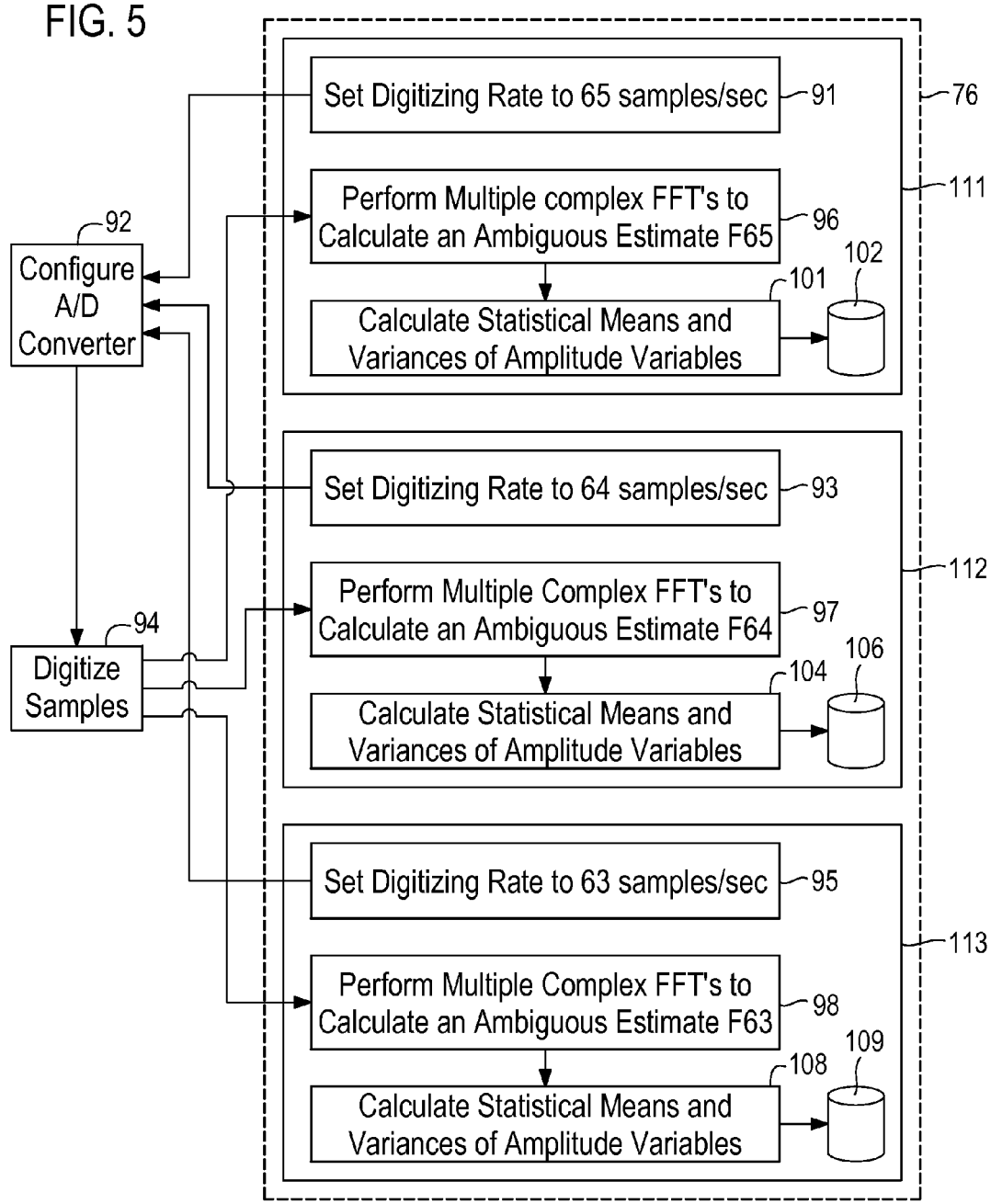
FIG. 5 is a flow chart of an algorithmic example for calculating an ambiguous frequency estimate; and, FIG. 6 is a flow chart of an algorithm for refining parameters related to estimating frequency in block 76 of FIG. 4.

Referring now to FIG. 5, block 76 of FIG. 4 can be further shown in the preferred embodiment as refined into a trio of sampling sets 111, 112, and 113. Assuming an optimized transmitter bounded between 1.8 MHz and 450 MHz with an A-D converter capable of sampling rates of less than or equal to 65 mega-samples per second with 14 bits of resolution, A-D converter 16 is configured 91-92 to a digitizing rate of 65 samples/sec and samples of $V_{FL}$ and $V_{FR}$ are taken 94. Multiple complex FFT's are then executed by FPGA 17 to calculate 96 an ambiguous frequency estimate (F65) at that sampling rate. A calculation of the statistical means and variances of amplitude variables associated with F65 is then made 101 and stored 102 for future use. That process 111 is then repeated using a sampling rate of 64 samples/sec 112 and 63 samples/sec 113. As shown, the processes in blocks 111, 112, and 113 may be performed in series or in parallel depending upon the quantity and capabilities of an A-D converter, and the speed and availability of micro-processors 19, 21 and FPGA 17.

In greater particularity, the following processing steps A-N, as executed and controlled by device 19, disclose the iterative processing sequences of blocks 71-87 of FIG. 4, and as associated with the preferred embodiment the steps shown in block 76 of FIG. 5 that yield the above described power parameters of step 87.

- A. The micro-computing device A 19 sets the clock generator 18 such that the two channel analog-to-digital converter (A/D) 16 samples at a rate of 65 mega-samples/second.
- B. The A/D 16 simultaneously samples voltages $V_{FL}$ 36 and $V_{FR}$ 37 and converts 1024 analog samples to digital values for both $V_{FL}$ and $V_{FR}$. These two sets of 1024 values are routed to the field-programmable gate array (FPGA) 17 and are referred to as $V65_{FL}(n)$ and $V65_{FR}(n)$ respectively, where n refers to the nth sample and ranges from 0 to 1023.
- C. The FPGA 17 performs a 1024-point complex Fourier transform. The Fourier transform is defined by the following equation:

$$X65_k = \sum_{n=0}^{N-1} w_n x_n e^{-nk2\pi j/N} \qquad \text{Equation(1)}$$

Where, in the above equation the variables and constants have the following definitions:
$j=\sqrt{-1}$,
N=size of the Fourier transform=1024,
$x_n = V65_{FL}(n) + V65_{FR}(n)$,
$w_n = 1 - 1.93*\cos(2\pi n/N) + 1.29*\cos(4\pi n/N) - 0.388*\cos(6\pi n/N) + 0.0322*\cos(8\pi n/N)$,
$V65_{FL}(n) = n^{th}$ time-series point from the analog-to-digital converter 16 representing voltage $V_{FL}$ 36,
$V65_{FR}(n) = n^{th}$ time-series point from the analog-to-digital converter 16 representing voltage $V_{FR}$ 37, and
$X65_k = k^{th}$ complex component of the Fourier Transform $(0 \leq k \leq N)$.

- D. The FPGA 17 examines the 1024 complex Fourier components $X65_0, X65_1 \ldots X65_{1023}$, selects the Fourier component of largest magnitude, and reports the associated subscript. The subscript is denoted by bn65 and ranges from 0 to 1023. The subscript, bn65, is reported to the micro-computing device A 19 of FIG. 2. During these calculations, FPGA 17 reports p65 to the micro-computing device A 19 of FIG. 2, where p65=(1024−bn65) module 1024. The FPGA also reports the complex Fourier components $X65_{bn65}$ and $X65_{p65}$ to the micro-computing device A 19 of FIG. 2.
- E. The micro-computing device A 19 computes complex values XL65, XR65, and scalar values DBL65, DBR65 from the following equations and stores these values in internal memory:

$$XL65 = X65_{bn65} + \text{conj}(X65_{p65}) \qquad \text{Equation (2A)}$$

$$XR65 = j*(\text{conj}(X65_{bn65}) - X65_{p65}) \qquad \text{Equation (2B)}$$

Where $j=\sqrt{-1}$, and
the operator conj( ) denotes complex conjugate.

$$DBL65 = 10*\log_{10}(XL65*\text{conj}(XL65)) \qquad \text{Equation (3A)}$$

$$DBR65 = 10*\log_{10}(XR65*\text{conj}(XR65)) \qquad \text{Equation (3B)}$$

- F. The process of paragraphs B, C, D, and E are repeated five times so that the micro-computing device A 19 has a total of six independent values of XL65, XR65, DBL65, and DBR65 stored in memory. These parameters are denoted by XL65$_i$, XR65$_i$, DBL65$_i$, and DBR65$_i$, where the subscript, i, ranges from 1 to 6. The micro-computing device A 19 stores the last value of bn65 and p65.
- G. The micro-computing device A 19 sets the clock generator 18 such that the two channel analog-to-digital converter 16 samples at a rate of 64 mega-samples/second. The process of paragraphs B, C, D, and E are conducted six times with notation changes (e.g. bn65, $XR65_{p65}$ becomes bn64 and $XR64_{p64}$ respectively) so that the micro-computing device A 19 has a total of six independent values of XL64, XR64, DBL64, and DBR64 stored in memory. These parameters are denoted by XL64$_i$, XR64$_i$, DBL64$_i$, and DBR64$_i$, where the subscript, i, ranges from 1 to 6. The micro-computing device A 19 also stores the last value of bn64 and p64 reported by the FPGA 17.
- H. The micro-computing device A 19 sets the clock generator 18 such that the two channel analog-to-digital converter 16 samples at a rate of 63 mega-samples/second. The process of paragraphs B, C, D, and E are conducted six times with notation changes (e.g. bn65, $X65_{p65}$ becomes bn63 and $X63_{p63}$ respectively) so that the micro-computing device A 19 has a total of six independent values of XL63, XR63, DBL63, and DBR63 stored in memory. These parameters are denoted by XL63$_i$, XR63$_i$, DBL63$_i$, and DBR63$_i$, where the subscript, i, ranges from 1 to 6. The micro-computing device A 19 also stores the last value of bn63 and p63 reported by the FPGA 17.
- I. The micro-computing device A 19 computes six values μL65, μL64, μL63, μR65, μR64, and μR63, using the following equations:

$$\mu L65 = \frac{1}{6}\sum_{i=1}^{6} DBL65_i \qquad \text{Equation (4A)}$$

$$\mu L64 = \frac{1}{6}\sum_{i=1}^{6} DBL64_i \qquad \text{Equation (4B)}$$

$$\mu L63 = \frac{1}{6}\sum_{i=1}^{6} DBL63_i \qquad \text{Equation (4C)}$$

$$\mu R65 = \frac{1}{6}\sum_{i=1}^{6} DBR65_i \qquad \text{Equation (4D)}$$

$$\mu R64 = \frac{1}{6}\sum_{i=1}^{6} DBR64_i \qquad \text{Equation (4E)}$$

$$\mu R63 = \frac{1}{6}\sum_{i=1}^{6} DBR63_i \qquad \text{Equation (4F)}$$

The micro-computing device A 19 compares the six results computed in Equations (4A) through (4F) and determines the largest result. If the largest result is either μL65, μL64, or μL63, the micro-computing device A 19 computes the statistical variances V65, V64, and V63 from the following set of equations:

$$V65 = \frac{1}{6}\sum_{i=1}^{6} (DBL65_i - \mu L65)^2$$

$$V64 = \frac{1}{6}\sum_{i=1}^{6} (DBL64_i - \mu L64)^2$$

$$V63 = \frac{1}{6}\sum_{i=1}^{6} (DBL63_i - \mu L63)^2$$

If the largest result is either μR65, μR64, or μR63, the micro-computing device A 19 computes V65, V64, and V63 from the following set of equations:

$$V65 = \frac{1}{6}\sum_{i=1}^{6}(DBR65_i - \mu R65)^2$$

$$V64 = \frac{1}{6}\sum_{i=1}^{6}(DBR64_i - \mu R64)^2$$

$$V63 = \frac{1}{6}\sum_{i=1}^{6}(DBR63_i - \mu R63)^2$$

J. The micro-computing device A 19 computes three frequencies (F65, F64, and F63) from the following equations:
Compute F65:
If bn65 is less than 513, then F65=bn65\*65 MHz/1024.
If bn65 is greater than 512, then F65=(1024−bn65)\*65 MHz/1024.
Compute F64:
If bn64 is less than 513, then F64=bn64\*64 MHz/1024.
If bn64 is greater than 512, then F64=(1024−bn64)\*64 MHz/1024.
Compute F63:
If bn63 is less than 513, then F63=bn63\*63 MHz/1024.
If bn63 is greater than 512, then F63=(1024−bn63)\*63 MHz/1024.

Figure 6:
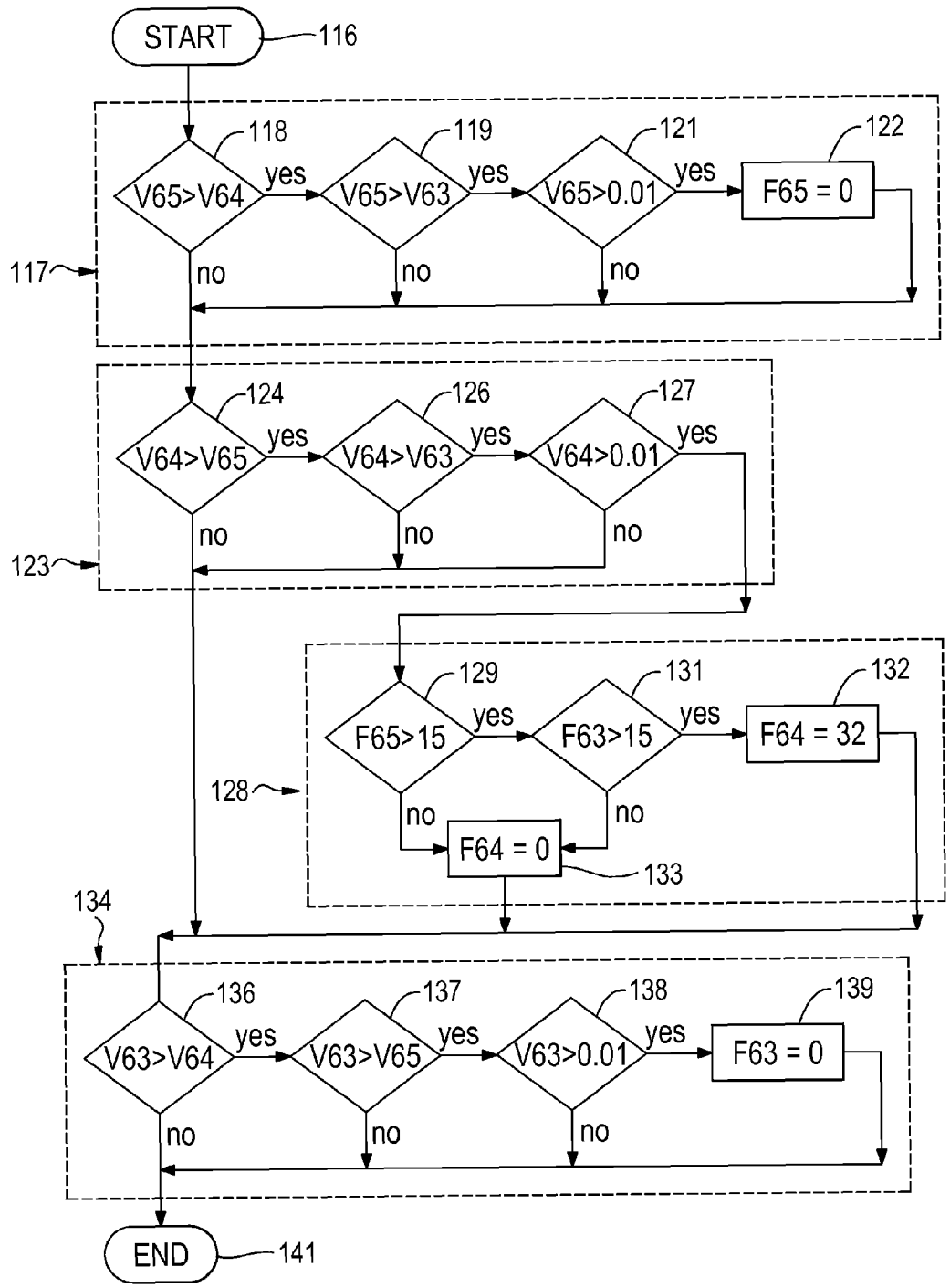

K. The micro-computing device A 19 uses a decision algorithm as shown in FIG. 6 to further refine the aliased frequency estimates F65, F64, and F63.

L. The micro-computing device A 19 computes intermediate results and the frequency estimate (FE) using the algorithm defined below:
Compute Roll65:
If F65 is less than or equal to (32.5 MHz−F65), then Roll65=F65.
If F65 is greater than (32.5 MHz−F65), then Roll65=32.5 MHz−F65.
Compute Roll63:
If F63 is less than or equal to (31.5 MHz−F63), then Roll63=F63.
If F63 is greater than (31.5 MHz−F63), then Roll63=31.5 MHz−F63.
Compute DF:
If Roll65 is greater than or equal to Roll63, then DF=F65−F64.
If Roll65 is less than Roll63, then DF=F64−F63.

Using the values shown in Table 1.0 below, the micro-computing device A 19 selects the row with the Delta value closest to DF and selects $C_1$ and $C_2$ from this row:

TABLE 1.0

| Delta (MHz) | $C_1$ | $C_2$ |
| --- | --- | --- |
| 0 | 0 | 1 |
| 1 | 1 | −1 |
| −1 | 1 | 1 |
| 2 | 2 | −1 |
| −2 | 2 | 1 |
| 3 | 3 | −1 |
| −3 | 3 | 1 |
| 4 | 4 | −1 |
| −4 | 4 | 1 |
| 5 | 5 | −1 |
| −5 | 5 | 1 |
| 6 | 6 | −1 |
| −6 | 6 | 1 |
| 7 | 7 | −1 |
| −7 | 7 | 1 |
| 8 | 8 | −1 |

TABLE 1.0-continued

Compute FE (Frequency Estimate)
If Roll65 is greater than or equal to Roll63, then FE=$C_1$\*65 MHz+$C_2$\*F65
If Roll65 less than Roll63, then FE=$C_1$\*64 MHz+$C_2$\*F64
Note: The error in the frequency estimate will typically be less than the resolution of the 65-MHz Fourier Transform (65 MHz/1024~0.0635 MHz).

Two examples are provided below to help clarify the algorithm defined in paragraph L.

Example #1

Assume the transmitter frequency is 1.91 MHz. This results in F63=1.907 MHz, F64=1.938 MHz, and F65=1.904 MHz. These three frequencies are processed by the algorithm of paragraph L as shown below:
Compute Roll65:
F65 is less than (32.5 MHz−F65), so Roll65=F65=1.904 MHz
Compute Roll63:
F63 is less than (31.5 MHz−F63), so Roll63=F63=1.907 MHz
Compute DF:
Roll65 is less than Roll63, so DF=F64−F63=0.0303 MHz
Selecting the row in Table 1 with the Delta value closest to DF results in selecting the top row. Selecting $C_1$ and $C_2$ from the top row results in $C_1$=0 and $C_2$=1.
Compute FE (Frequency Estimate):
Roll65 less than Roll63, so FE=$C_1$\*64 MHz+$C_2$\*F64=0\*64 MHz+1\*1.938 MHz=1.938 MHz. The frequency estimate is (FE=1.938 MHz), whereas the true frequency is 1.91 MHz. The error in the estimate (0.0275 MHz) is within the expected tolerance of the algorithm (~0.0635 MHz).

Example #2

Assume the transmitter frequency is 500 MHz. This results in F63=3.999 MHz, F64=12 MHz, and F65=19.995 MHz. These three frequencies are processed by the algorithm of paragraph L as shown below:
Compute Roll65:
F65 is greater than (32.5 MHz−F65), so Roll65=(32.5 MHz−F65)=12.505 MHz
Compute Roll63:
F63 is less than (31.5 MHz−F63), so Roll63=F63=3.999 MHz
Compute DF:
Roll65 is greater than Roll63, so DF=F65−F64=7.995 MHz
Selecting the row in Table 1 with the Delta value closest to DF results in selecting the bottom row. Selecting $C_1$ and $C_2$ from the bottom row results in $C_1$=8 and $C_2$=−1.
Compute FE (Frequency Estimate):
Roll65 is greater than Roll63, so FE=$C_1$\*65 MHz+$C_2$\*F65=8\*65 MHz−1\*19.995=500.005 MHz. The frequency estimate is (FE=500.005 MHz) whereas the true frequency is 500 MHz. The error in the estimate (0.005 MHz) is within the expected tolerance of the algorithm (~0.0635 MHz).

M. The micro-computing device A 19 picks the minimum variance Fourier samples for further processing. This is done by comparing the values V65, V64, and V63 from paragraph I and picking the one of least magnitude. If V63 is the least, then the micro-computing device A 19 computes the complex values VP2, VP3 and the phase coefficient, PC, from the following:

$PC = (-1)^{INT(2*FE/63)}$, $VP2 = \text{Real}(XL63_1) + PC*\text{Imaginary}(XL63_1)$, and $VP3 = \text{Real}(XR63_1) + PC*\text{Imaginary}(XR63_1)$, where XL63$_1$ and XR63$_1$ are results generated in paragraph H, and FE is the frequency estimate computed in paragraph L. The operator INT(x) denotes the integer portion of x. The expressions Real(x) and Imaginary(x) denote the real and imaginary parts respectively of the complex variable x. If V64 is the least, then the micro-computing device A 19 computes the complex values VP2, VP3 and the phase coefficient, PC, from the following $PC = (-1)^{INT(2*FE/64)}$, $VP2 = \text{Real}(XL64_1) + PC*\text{Imaginary}(XL64_1)$, and $VP3 = \text{Real}(XR64_1) + PC*\text{Imaginary}(XR64_1)$, where XL64$_1$ and XR64$_1$ are results generated in paragraph G, and FE is the frequency estimate computed in paragraph L. The operator INT(x) denotes the integer portion of x. The expressions Real(x) and Imaginary(x) denote the real and imaginary parts respectively of the complex variable x. If V65 is the least, then the micro-computing device A 19 computes the complex values VP2, VP3 and the phase coefficient, PC, from the following:

$PC = (-1)^{INT(2*FE/65)}$, $VP2 = \text{Real}(XL65_1) + PC*\text{Imaginary}(XL65_1)$, and $VP3 = \text{Real}(XR65_1) + PC*\text{Imaginary}(XR65_1)$, where XL65$_1$ and XR65$_1$ are results generated in paragraph F, and FE is the frequency estimate computed in paragraph L. The operator INT(x) denotes the integer portion of x. The expressions Real(x) and Imaginary(x) denote the real and imaginary parts respectively of the complex variable x.

N. The micro-computing device A 19 computes parameters s and κ from the following where the parameters α, β, and $\gamma_0$ will be defined later.

$$s = \gamma_0 \frac{\alpha + VP3/VP2}{1 + \beta VP3/VP2}$$

$$\kappa = \left| \frac{1+s}{1-s} \right|$$

The micro-computing device A 19 computes the scattering parameter $S_{11}$, the magnitude of the forward-direction-traveling and reverse-direction-traveling voltage waveforms using the following equations:

If κ≤1.1 then $$S_{11} = \gamma_0 \frac{\alpha + VP3/VP2}{1 + \beta VP3/VP2}.$$

If κ>1.1 then $$S_{11} = \gamma_i \frac{\alpha + VP3/VP2}{1 + \beta VP3/VP2}.$$

$|V_f| = |q_{11}VP2 + q_{12}VP3|$ $|V_r| = |V_f||S_{11}|$ where $S_{11}$ is defined as the complex ratio of the reverse-direction-traveling voltage to the forward-direction-traveling voltage waveform on the coaxial transmission line, VP3 and VP2 are results from paragraph M, and the operator |x| denotes magnitude of the complex variable x. The parameters α, β, $\gamma_0$, $\gamma_i$, $q_{11}$, and $q_{12}$ are determined from measurements made as part of the manufacturing process. These parameters are a function of frequency and consequently must be measured over the operating frequency range of the apparatus and stored in memory of the micro-computing device A 19, or in other connected memory device, as a calibration table (see block 82 of FIG. 4). The required frequency-measurement-interval depends on characteristics of the semi-directional coupler 12. Empirical results for a semi-directional coupler similar to a microstrip have shown that sufficient performance accuracy (approximately ±3% error in power estimates and 30 dB directivity) can be obtained by linearly interpolating between results obtained with values of α, β, $\gamma_0$, $\gamma_i$, $q_{11}$, and $q_{12}$ measuring at 250-kHz intervals over the frequency range from 1.7 MHz to 500 MHz. The micro-computing device A 19 then computes the SWR (Standing Wave Ratio) on the transmission-line connected to the apparatus's output connector 11 using the following equation:

$$SWR = \frac{1 + |S_{11}|}{1 - |S_{11}|}$$

where $|S_{11}|$ denotes magnitude of complex quantity $S_{11}$. The micro-computing device A 19 computes the magnitude of the forward-direction-traveling power and the reverse-direction-traveling power on the coaxial transmission line connected to the apparatus's output connector 11 using the following equations:

$$P_f = \frac{|V_f|^2}{Z_0}, \text{ and}$$

$$P_r = \frac{|V_r|^2}{Z_0},$$

where $P_f$ and $P_r$ are the forward- and reverse-traveling power on the coaxial transmission line connected to the output connector 11 of the apparatus. The parameter, $Z_0$, is the characteristic impedance of the transmission line connected to the output connector 11 of the apparatus. The micro-computing device A 19 computes the delivered power $P_d$ using the following equation:

$$P_d = P_f - P_r,$$

where $P_f$ and $P_r$ are defined as above. The micro-computing device A 19 computes the complex impedance of the load attached to the output connector 11 of the apparatus using the following equation:

$$Z = Z_0 \frac{1 + S_{11}}{1 - S_{11}}$$

The micro-computing device A 19 sends the computed magnitudes $V_f$, $V_r$, $P_f$, $P_r$, $P_d$ and the computed complex quantities $S_{11}$, VP2, VP3 and Z to the micro-computing device B 21 and to the general-purpose PC-type USB (Universal Serial Bus) port 38. Micro-computing device B 21 coordinates with the User Interface 24 and presents the user-requested data on the Analog Display 22 and the Digital Display 23.

The process is then restarted with paragraph A. The entire process (paragraphs A-N) requires less than 5 milliseconds to complete. Averaging can be used to improve accuracy of the measured and computed parameters $V_f$, $V_r$, $P_f$, $P_r$, $P_d$, Z and $S_{11}$ Example Method of Determining Parameters $\alpha$, $\beta$, $\gamma_i$, $\gamma_0$, $q_{11}$, and $q_{12}$ There are many methods of determining $\alpha$, $\beta$, $\gamma_i$, $\gamma_0$, $q_{11}$, and $q_{12}$. The following method was used in developing the preferred embodiment to prove its utility and absolute accuracy. The parameters are frequency dependent and therefore must be measured at discrete intervals over the frequency range of the apparatus. The number of intervals required depends on characteristics of the semi-directional Coupler 12. A discrete frequency spacing of 0.25 MHz from 1.7 MHz to 500 MHz was found to be more than adequate for a semi directional coupler resembling a microstrip coupler 0.1 meters long.

A. Connect a reference device of impedance $Z_0$ to the apparatus' input connector 10, where $Z_0$ is the desired reference impedance. For example, use a 50-Ohm resistor for the reference device if the apparatus is intended to be used with a 50-Ohm characteristic-impedance coaxial transmission line connected to its output connector 11. Apply a sinusoidal voltage of desired frequency to the apparatus's output connector 11. Operate the apparatus and use the results of paragraph N (reported via the USB port 38) to compute the complex parameter $\beta$ as shown below.

$$\beta = -\frac{VP2}{VP3}$$

B. Connect a reference device of impedance $Z_0$ to the apparatus's output connector 11, where $Z_0$ is the desired reference impedance. Apply a sinusoidal voltage of desired frequency and known RMS (Root Mean Square) amplitude, $V_{cal}$, to the apparatus's input connector 10. Operate the apparatus and use the results of paragraph N (reported via the USB port 38), and $V_{cal}$ to compute the complex parameters $\alpha$ and $q_{11}$, and scalar parameter $q_{12}$ as shown below.

$$\alpha = -\frac{VP3}{VP2}$$

$$q_{12} = \left| \frac{V_{cal}}{\frac{VP2}{\beta} + VP3} \right|$$

$$q_{11} = \frac{q_{12}}{\beta}$$

C. Connect a non-radiating reference device of infinite impedance to the apparatus's output connector 11. Apply a sinusoidal voltage of desired frequency to the apparatus's input connector 10. Operate the apparatus and use the results of paragraph N (reported via the USB port 38) to compute the complex parameter $\gamma_i$ as shown below.

$$\gamma_i = \frac{VP2 + \beta VP3}{VP3 + \alpha VP2}$$

D. Connect a non-radiating reference device of zero impedance to the apparatus's output connector 11. Apply a sinusoidal current of desired frequency to the apparatus's input connector 10. Operate the apparatus and use the results of paragraph N (reported via the USB port 38) to compute the complex parameter $\gamma_0$ as shown below.

$$\gamma_0 = -\left( \frac{VP2 + \beta VP3}{VP3 + \alpha VP2} \right)$$

Note: Averaging can be used to enhance accuracy of the computed parameters $\alpha$, $\beta$, $\gamma_i$, $\gamma_0$, $q_{11}$, and $q_{12}$.

As may now be understood, the afore-described power meter exhibits improved accuracy, directivity, bandwidth, power range, and construction cost relative to other modern systems. The apparatus measures, processes, and displays forward- and reverse-traveling voltage and power waves on a coaxial transmission line of a RF power transmission system where an RF source sends forward RF signals to an RF load. Additionally, the meter computes and displays the following relevant power information: (a) forward- and reverse-traveling power; (b) Standing Wave Ratio ("SWR"); (c) real and imaginary parts of the load impedance; (d) delivered power; (e) forward- and reverse-traveling voltage; and (f) a complex scattering parameter $S_{11}$. By providing these parameters in the disclosed configuration, the system avoids the limitations and difficulties of current systems and exhibits features and advantages heretofore not obtainable. For example, the system can accommodate a much larger frequency range (e.g. 1.8 MHz to 500 MHz or a ratio greater than 270:1) with a feasible ratio exceeding 300:1. Further, the apparatus accommodates a large range of power (e.g. 3000 watts to 1 watt or a ratio of 3000:1) with a feasible ratio exceeding 10,000:1. The semi-directional coupler utilized does not have to have high directivity and so is simpler, requires no machining, and is less expensive to manufacture than the required high directivity directional coupler of current devices.

While the apparatus has been shown in embodiments described herein, it will be obvious to those skilled in the art that the apparatus is not so limited but may be modified with various changes that are still within the spirit of the apparatus.

Having set forth the nature of the present invention, what is claimed is:

1. An apparatus for measuring radio frequency power parameters in a radio frequency transmission system having a radio frequency source and a radio frequency load, comprising:
   a. connectors for electrically interposing said apparatus between said source and said load;
   b. a semi-directional coupler for electrically receiving a first signal and a second signal from said transmission system through said connectors;
   c. at least one electrical filter applied to at least one of said first and second signals for compensating for the frequency dependant coupling nature of said electrical coupler;
   d. an A-D converter for sampling said filtered first and second signals;
   e. a signal processing module for making complex calculations on said sampled filtered first and second signals; and,
   f. means running on said processing module for calculating a power of a radio signal propagated through said transmission system from said source, said power calculating means including means for calculating an ambiguous frequency estimate for said first and second signal, means for converting said ambiguous frequency estimate into an unambiguous value, means for calculating complex amplitudes of said first and second signal, means for mathematically compensating for limitations of said semi-directional coupler, and using interim calculation results from said ambiguous frequency estimate calculating means, said converting means, said calculating complex amplitudes means, and said compensating means for calculating power parameters in said system and outputting said power parameters for further human use.

2. The apparatus as recited in claim 1, wherein said signal processing module comprises two microprocessors and a field programmable gate array, and wherein said field programmable gate array is configured to execute fast Fourier transforms.

3. The apparatus as recited in claim 1, wherein said semi-directional coupler comprises a microstrip.

4. The apparatus as recited in claim 3, wherein said microstrip comprises a driven line and a coupled line, each line having a corresponding left and right end, and wherein said apparatus further comprises a left and right filter for filtering said first and second signals separately.

5. The apparatus as recited in claim 4, wherein said A-D converter comprises a two channel converter.

6. The apparatus as recited in claim 5, wherein each said filter comprises an RC coupled input to said A-D converter.

7. The apparatus as recited in claim 1, further including at least one display connected to an output of said processing module for manifesting said power parameters in human perceptible form.

8. The apparatus as recited in claim 1, wherein said filter comprises an RC coupled input to said A-D converter.

9. A method for measuring radio frequency power parameters in a radio frequency power transmission system having a radio frequency source and a radio frequency load, comprising the steps of:
   a. receiving a first signal and a second signal through a semi-directional coupler electrically connected to said transmission system;
   b. filtering said first signal and second signal to facilitate digitization of said signals;
   c. digitally sampling said filtered first and second signals to create a digital representation of said first and second signals;
   d. calculating a plurality of ambiguous frequency estimates of said first and second digital signals;
   e. converting said ambiguous frequency estimates of said first and second digital signals into an unambiguous frequency value;
   f. identifying variable coefficients from a calibration table;
   g. calculating the complex amplitudes of said first and second digital signals responsive to said coefficient identification step;
   h. mathematically compensating for inherent limitations of said coupler; and
   i. responsive to said step of converting ambiguous frequency estimates into unambiguous frequency value and said step of calculating said complex amplitudes of said first and second digital signals, calculating power parameters representative of transmission power exhibited by said radio power transmission system.

10. The method as recited in claim 9 wherein said step of calculating an ambiguous frequency estimate of said first and second digital signal comprises the steps of:
   a. establishing a series of sampling rates sufficient for digitization of said first and second signals within the bounds of a pre-selected frequency range;
   b. sampling said first and second signals along said series of sampling rates to obtain a multiplicity of time series data sets representative of said signals;
   c. applying multiple Fourier transforms to each said time series data sets to calculate an aliased ambiguous frequency estimate for each said time series data set to obtain an ambiguous frequency estimate for each said time series data set; and,
   d. calculating statistical means and variances of amplitudes of each said time series data set and recording same for later use.

11. The method of claim 10 wherein said step of converting said ambiguous frequency estimates of said first and second digital signals into an unambiguous frequency result comprises the steps of:
   a. computing a set of Roll values in accordance with pre-established rules;
   b. establishing an index value k where k represents the Roll value that is greater or equal to all other Roll values;
   c. calculating a Delta Frequency from the equation $DF=F_k-F_{k-1}$, wherein $F_k$ is the frequency estimate from the $k^{th}$ sample rate;
   d. selecting variable coefficients $C_1$ and $C_2$ by selecting a frequency Delta value nearest to said Delta Frequency DF and matching said Delta value to values of $C_1$ and $C_2$ held in a data table associating Delta values with related $C_1$ and $C_2$ values; and,
   e. computing an unambiguous frequency estimate FE from the equation $FE=C_1*SR_k+C_2*F_k$, wherein $SR_k$ is the is the $k^{th}$ sampling rate.

12. The method of claim 11 wherein said power transmission system includes a forward traveling signal and a reverse traveling signal relative to said source and load, and said step of mathematically compensating for inherent limitations of said coupler, comprises the steps of:
   a. applying a frequency dependant mathematical transformation on complex amplitudes obtained in said step of calculating the complex amplitudes of said first and second digital signals to calculate a first value having a complex amplitude proportional to the radio frequency voltage of said forward traveling signal; and, b. applying a frequency dependant mathematical transformation on complex amplitudes obtained in said step of calculating the complex amplitudes of said first and second digital signals to calculate a second value having a complex amplitude proportional to the radio frequency voltage of said reverse traveling signal.

13. The method as recited in claim 12 wherein said step of calculating power parameters representative of the real transmission power of said transmission system comprises calculating the forward traveling voltage amplitude of said forward traveling signal, calculating the reverse traveling voltage amplitude of said reverse traveling signal, calculating the complex scattering parameter of said transmission system, calculating the forward traveling power of said forward traveling signal, calculating the reverse traveling power of said reverse traveling signal, calculating the delivered power in said transmission system, and calculating the complex load impedance in said transmission system.

14. The method as recited in claim 13 further including the step of displaying said transmission system power parameters on a human perceptible display device.

15. The method of claim 9 wherein said step of converting said ambiguous frequency estimates of said first and second digital signals into an unambiguous frequency comprises the steps of:
   a. computing a set of Roll values in accordance with pre-established rules;
   b. establishing an index value k where k represents the Roll value that is greater or equal to all other Roll values;
   c. calculating a Delta Frequency from the equation $DF = F_k - F_{k-1}$, wherein $F_k$ is the frequency estimate from the $k^{th}$ sample rate;
   d. selecting variable coefficients $C_1$ and $C_2$ by selecting a frequency Delta value nearest to said Delta Frequency DF and matching said Delta value to values of $C_1$ and $C_2$ held in a data table associating Delta values with related $C_1$ and $C_2$ values; and,
   e. computing an unambiguous frequency estimate from the equation $FE = C_1 * SR_k + C_2 * F_k$, wherein $SR_k$ is the is the $k^{th}$ sampling rate.

16. The method of claim 9 wherein said power transmission system includes a forward traveling signal and a reverse traveling signal relative to said source and load, and said step of mathematically compensating for inherent limitations of said coupler, comprises the steps of:
   a. applying a frequency dependant mathematical transformation on complex amplitudes obtained in said step of calculating the complex amplitudes of said first and second digital signals to calculate a first value having a complex amplitude proportional to the radio frequency voltage of said forward traveling signal; and,
   b. applying a frequency dependant mathematical transformation on complex amplitudes obtained in said step of calculating the complex amplitudes of said first and second digital signals to calculate a second value having a complex amplitude proportional to the radio frequency voltage of said reverse traveling signal.

17. The method of claim 9 wherein said step of calculating said complex amplitudes of said first and second digital signals further comprises the step of applying a Fourier transform to said first and second digital signals to measure complex amplitudes of said first and second digital signals.

18. The method of claim 9 wherein said step of mathematically compensating for inherent limitations of said coupler comprises the steps of:
   a. applying a frequency-dependant mathematical transformation on said complex amplitudes to calculate one value whose complex amplitude is proportional to only the amplitude of a forward-traveling RF voltage; and,
   b. calculating a second value whose complex amplitude is proportional to only the amplitude of a reverse traveling RF voltage.

19. An apparatus for measuring radio frequency power parameters in a radio frequency transmission system having forward and reverse traveling signals relative to a radio frequency source and a radio frequency load, comprising:
   a. means for electrically connecting said apparatus to said transmission system such that said apparatus is electrically interposed between said source and said load;
   b. means for passing said reverse and forward traveling signals through a semi-directional coupler from said connecting means to produce a left and right signal;
   c. filter means connected to said semi-directional coupler for compensating for the frequency dependant coupling nature of said semi-directional coupler in each said right and left signal;
   d. converter means for digitally sampling said filtered right and left signals;
   e. signal processing means for making complex calculations on said sampled and filtered right and left signals; and,
   f. means running on said processing means for calculating a power of a radio signal propagated through said transmission system from said source, said power calculating means including means for calculating an ambiguous frequency estimate for said forward and reverse signals, means for converting said ambiguous frequency estimate into an unambiguous value, means for calculating complex amplitudes of said forward and reverse signals, means for mathematically compensating for limitations of said semi-directional coupler, and using interim calculation results from said ambiguous frequency estimate calculating means, said converting means, said complex amplitudes calculating means, and said compensating means for calculating power parameters in said transmission system and outputting said power parameters for further human use.

20. The apparatus as recited in claim 19, wherein said signal processing means comprises at least one microprocessor and one programmable logic array, and wherein said programmable logic array is configured to execute fast Fourier transforms.

21. The apparatus as recited in claim 20, wherein said coupler means comprises a micro strip.

22. The apparatus as recited in claim 21, wherein said microstrip comprises a driven line and a coupled line, each line having a corresponding left and right end corresponding to said left and right signals, and wherein said filtering means comprises a left RC filter connected to said left end and a right RC filter connected to said right end to allow for filtering of said right and left signals separately.

* * * * *